(12) United States Patent
Lee et al.

(10) Patent No.: US 10,852,259 B2
(45) Date of Patent: Dec. 1, 2020

(54) APPARATUS FOR X-RAY INSPECTION, AND A METHOD FOR MANUFACTURING A SEMICONDUCTOR DEVICE USING THE SAME

(71) Applicant: Samsung Electronics Co., Ltd., Suwon-si (KR)

(72) Inventors: Kyoung Hwan Lee, Hwaseong-si (KR); Sang Min Kim, Seoul (KR); Young Hoon Sohn, Incheon (KR); Yu Sin Yang, Seoul (KR); Chi Hoon Lee, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/115,884

(22) Filed: Aug. 29, 2018

(65) Prior Publication Data

US 2019/0187077 A1  Jun. 20, 2019

(30) Foreign Application Priority Data

Dec. 14, 2017 (KR) ........................ 10-2017-0171860

(51) Int. Cl.
*G01N 23/223* (2006.01)
*H01L 21/67* (2006.01)
*H01L 21/66* (2006.01)

(52) U.S. Cl.
CPC ..... *G01N 23/223* (2013.01); *H01L 21/67288* (2013.01); *H01L 22/12* (2013.01); *G01N 2223/608* (2013.01); *G01N 2223/646* (2013.01)

(58) Field of Classification Search
CPC ........... G01N 23/223; G01N 2223/646; G01N 2223/60; G01N 2223/608; H01L 22/12; H01L 21/67288
See application file for complete search history.

(56) References Cited

U.S. PATENT DOCUMENTS

| 6,608,366 B1 * | 8/2003 | Fogelson | H01L 21/561 |
| | | | 257/666 |
| 7,432,594 B2 * | 10/2008 | Ashida | H01L 21/566 |
| | | | 257/735 |
| 7,663,211 B2 * | 2/2010 | Noquil | H01L 23/36 |
| | | | 257/675 |
| 7,745,929 B2 * | 6/2010 | Otremba | H01L 23/49524 |
| | | | 257/718 |

(Continued)

FOREIGN PATENT DOCUMENTS

| CN | 106323981 B | * 11/2017 |
| KR | 1318826 | 10/2013 |

*Primary Examiner* — Edward Chin
(74) *Attorney, Agent, or Firm* — Myers Bigel, P.A.

(57) ABSTRACT

An apparatus for X-ray inspection is provided. The apparatus includes: a stage on which an inspection target is loaded, the stage including a first surface and an opposite second surface; an X-ray generator disposed on or over the first surface of the inspection target and configured to irradiate the inspection target with incident X-rays; and a detection system disposed on or under the second surface of the inspection target and configured to detect first transmitted X-rays transmitted through the inspection target. The detection unit includes a first lens system and a second lens system. The first transmitted X-rays pass through one of the first lens system and the second lens system. The second lens system includes a micro zone plate.

16 Claims, 18 Drawing Sheets

(56) References Cited

U.S. PATENT DOCUMENTS

| | | | |
|---|---|---|---|
| 7,768,105 B2 * | 8/2010 | Cruz | H01L 24/41 |
| | | | 257/676 |
| 7,880,280 B2 * | 2/2011 | Otremba | H01L 24/40 |
| | | | 257/676 |
| 7,949,093 B2 | 5/2011 | Kataoka et al. | |
| 8,426,963 B2 * | 4/2013 | Zeng | H01L 23/49562 |
| | | | 257/723 |
| 8,891,729 B2 | 11/2014 | Matoba et al. | |
| 9,506,876 B2 | 11/2016 | Urano et al. | |
| 9,778,213 B2 | 10/2017 | Bakeman et al. | |
| 9,784,699 B2 | 10/2017 | Zarkadas et al. | |
| 10,199,312 B1 * | 2/2019 | Rivera-Marty | H01L 24/81 |
| 2006/0038265 A1 * | 2/2006 | Oberlin | H01L 23/492 |
| | | | 257/676 |
| 2008/0061234 A1 * | 3/2008 | Nakamura | G01N 23/2252 |
| | | | 250/310 |
| 2013/0001792 A1 * | 1/2013 | Uno | H01L 23/4824 |
| | | | 257/773 |
| 2014/0001616 A1 * | 1/2014 | Daniels | H01L 23/49541 |
| | | | 257/676 |
| 2016/0190095 A1 * | 6/2016 | Celaya | H01L 23/49548 |
| | | | 438/112 |
| 2016/0204164 A1 | 7/2016 | Zhao et al. | |
| 2017/0011973 A1 | 1/2017 | Tingay et al. | |
| 2017/0031054 A1 | 2/2017 | Matoba et al. | |
| 2017/0178928 A1 * | 6/2017 | Williams | H01L 24/40 |
| 2017/0234814 A1 * | 8/2017 | Ogata | G01N 23/223 |
| | | | 378/44 |

\* cited by examiner

APPARATUS FOR X-RAY INSPECTION, AND A METHOD FOR MANUFACTURING A SEMICONDUCTOR DEVICE USING THE SAME

RELATED APPLICATIONS

This application claims priority from Korean Patent Application No. 10-2017-0171860, filed Dec. 14, 2017, the disclosure of which is incorporated by reference herein in its entirety.

BACKGROUND

The present inventive concept relates to an apparatus for X-ray inspection and a method for manufacturing a semiconductor device using the same.

A semiconductor inspection process may include a defect inspection step and a defect review step of checking characteristics of the inspected defect. Ultraviolet (UV)/deep ultraviolet (DUV) microscopes may be used as a wafer defect inspection apparatus. The ultraviolet/deep ultraviolet microscope has an advantage of having a wide field of view (FOV) and is capable of inspecting the defect at high speed.

Also, a high resolution electron microscope may be used as the wafer defect analysis apparatus. The high resolution electron microscope has the advantage of having a high resolution to be able to check the form of defect in a relatively detailed manner.

As the semiconductor structure gradually becomes thicker (for example, a vertical stack structure), semiconductor defect inspection and analysis using existing ultraviolet/deep ultraviolet microscopes and electron microscopes have limitations. The ultraviolet/deep ultraviolet microscopes and electron microscopes have low permeability with respect to the semiconductor materials. Accordingly, when inspecting and analyzing defects of the semiconductor structure, using the ultraviolet/deep ultraviolet microscope and the electron microscope, it becomes more difficult to inspect and analyze the defects present in at least a part of the semiconductor structure, for example, in the substructure of the semiconductor structure.

SUMMARY

An aspect of the present inventive concept provides an apparatus for high-speed X-ray inspection.

Another aspect of the present inventive concept provides an apparatus for X-ray inspection capable of detecting a bottom defect of a structure.

Still another aspect of the present inventive concept provides a method for manufacturing a semiconductor device using an apparatus for X-ray inspection.

According to some embodiments of the present inventive concept, an apparatus for X-ray inspection includes: a stage on which an inspection target is loaded, the stage including a first surface and an opposite second surface; an X-ray generator disposed on or over the first surface of the inspection target and configured to irradiate the inspection target with incident X-rays; and a detection system disposed on or under the second surface of the inspection target and configured to detect first transmitted X-rays transmitted through the inspection target. The detection system includes a first lens system and a second lens system. The first transmitted X-rays pass through one of the first lens system and the second lens system. The first lens system may not include a micro zone plate (MZP), and the second lens unit may include a micro zone plate (MZP).

According to some embodiments of the present inventive concept, an apparatus for X-ray inspection includes: a stage on which an inspection target is loaded, the stage including a first surface and an opposite second surface; an X-ray generator disposed on or over the first surface of the inspection target and configured to irradiate the inspection target with incident X-rays; and a detection system disposed on or under the second surface of the inspection target and configured to detect first transmitted X-rays transmitted through the inspection target. The detection system includes a first lens system and a second lens system. The inspection target includes a first region including a defect and a second region that is free of defects. The first lens system is configured to receive the first transmitted X-rays transmitted through one of the first region and the second region, and the second lens system is configured to receive the first transmitted X-rays transmitted through only the first region.

According to some embodiments of the present inventive concept, a method for manufacturing a semiconductor device, the method includes: providing a wafer; inspecting the wafer, using an apparatus for X-ray inspection; and manufacturing the semiconductor device using the inspected wafer. The apparatus for X-ray inspection includes: a stage on which an inspection target is loaded, the stage including a first surface and a second opposite surface; an X-ray generator disposed on or over the first surface of the inspection target and configured to irradiate the inspection target with incident X-rays; and a detection system disposed on or under the second surface of the inspection target and configured to detect first transmitted X-rays transmitted through the inspection target. The detection system includes a first lens system and a second lens system. The first transmitted X-rays pass through one of the first lens system and the second lens system. The first lens system may not include a micro zone plate (MZP), and the second lens system may include a micro zone plate (MZP).

Aspects of the present inventive concept are not limited to those mentioned above and other aspects which are not mentioned can be clearly understood by those skilled in the art from the description below.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Figure 1:
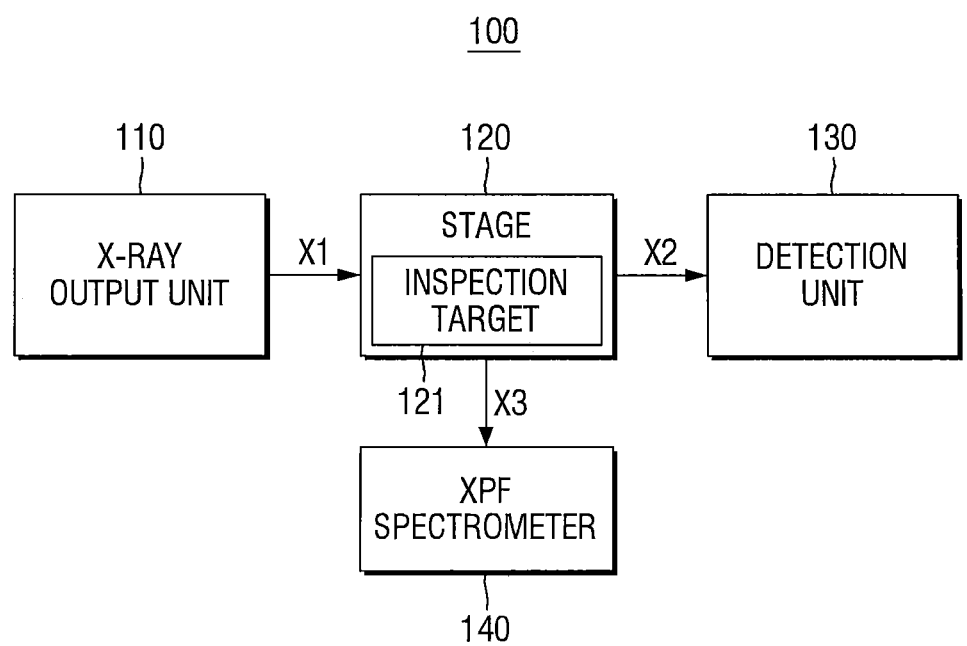
FIG. 1 is an example diagram for illustrating an apparatus for X-ray inspection according to some embodiments.
Figure 2:
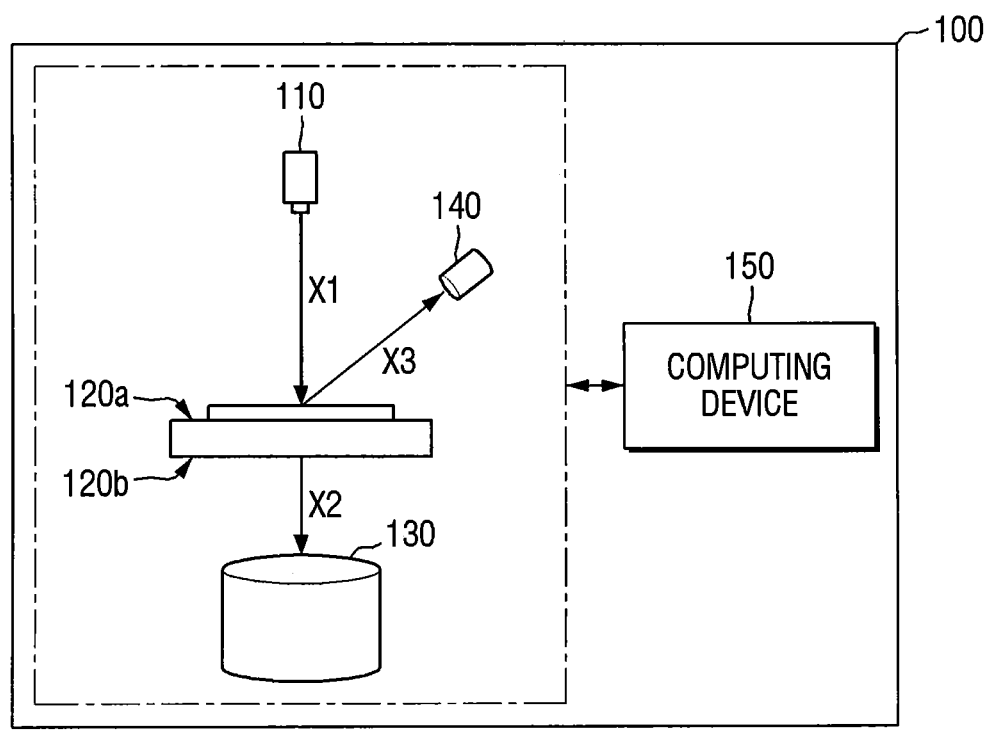
FIG. 2 is an example diagram for illustrating X-ray flow of the apparatus for X-ray inspection according to some embodiments.

FIG. 1 is an example diagram for illustrating an apparatus for X-ray inspection according to some embodiments. FIG. 2 is an example diagram for illustrating X-ray flow of the apparatus for X-ray inspection according to some embodiments.

Referring to FIGS. 1 and 2, an apparatus 100 for X-ray inspection according to some embodiments includes an X-ray output unit, X-ray output system, or X-ray generator 110, a stage 120 on or to which an inspection target 121 is loaded, a detection unit or detection system 130 which receives first transmitted X-rays (X2), an X-ray fluorescence (XRF) spectrometer 140 which receives characteristic x-rays (X3), and a computing device or controller 150.

The stage 120 may include a first surface 120a and a second surface 120b that face each other or are opposite to one another. The stage 120 may be a position to which the inspection target 121 is loaded.

The inspection target 121 may be loaded on the first surface 120a of the stage 120. The inspection target 121 may include a plurality of patterns. For example, the inspection target 121 may be a wafer including a plurality of chips. However, the present inventive concept is not limited thereto, and the inspection target 121 may be any material or object that requires analysis, such as a structure, a form, and a component.

The X-ray output unit 110 may be disposed on or over the first surface 120a of the stage 120. For example, the X-ray output unit 110 may be disposed on or over the inspection target 121. In other words, the inspection target 121 may be located between the stage 120 and the X-ray output unit 110.

The X-ray output unit 110 may generate X-rays. Further, the X-ray output unit 110 may irradiate at least a part of the inspection target 121 with incident X-rays (X1). The X-ray output unit 110 may generate X-rays, for example, by causing electrons accelerated in a vacuum or high voltage state to collide with a metal target. At this time, the X-ray output unit 110 may irradiate the inspection target 121 with the generated X-rays. For example, when the X-ray output unit 110 irradiates the inspection target 121 with X-rays, the X-ray output unit 110 may use an optical mirror.

At least a part or portion of the incident X-rays (X1) irradiated to the inspection target 121 may collide with the inspection target 121. The incident X-rays (X1) colliding with the inspection target 121 may generate the characteristic X-rays (X3).

Specifically, at least a part of the incident X-rays (X1) irradiated to the inspection target 121 may collide with atoms constituting the inspection target 121. At this time, the electrons of the collided atom may enter an excited state. Thereafter, the electrons of the collided atom may return to a ground state. When the electrons of the collided atom return to the ground state, energy may be emitted. At this time, the emitted energy may generate the characteristic X-rays (X3). The emitted energy is the excitation energy of the atoms that constitutes the inspection target 121.

The characteristic X-rays (X3) may have a wavelength corresponding to the excitation energy. The excitation energy differs for each type of atom. Thus, the same type of atom has the same excitation energy. Therefore, the same type of atom may generate characteristic X-rays (X3) having the same wavelength.

That is, characteristic X-rays (X3) generated by the same material always have the same wavelength. In other words, if the inspection target 121 is made up of one material, the characteristic X-rays (X3) may have the same wavelength. Further, if the inspection target 121 is made up of a plurality of materials, the characteristic X-rays (X3) may include a plurality of different or discrete wavelengths.

The XRF spectrometer 140 may be placed on or over the stage 120. For example, the XRF spectrometer 140 may be placed on or over the first surface 120a of the stage 120.

The XRF spectrometer 140 may receive the characteristic X-rays (X3) generated by at least a part or portion of the incident X-rays (X1) irradiated to the inspection target 121.

The wavelength of the characteristic X-rays (X3) may differ for each atom. Therefore, the XRF spectrometer 140 may analyze the wavelength of the received characteristic X-rays (X3) to analyze the constituent elements of the inspection target 121.

In other words, the incident X-rays (X1) may be irradiated to a portion of or the entire inspection target 121. At this time, at least a part of the incident X-rays (X1) irradiated to the portion of or the entire inspection target 121 may generate the characteristic X-rays (X3). At this time, the XRF spectrometer 140 may receive the characteristic X-rays (X3). The received characteristic X-rays (X3) may be analyzed to determine the constituted elements of the portion of or the entire inspection target 121 by the XRF spectrometer 140.

At least a part of the incident X-rays (X1) irradiated to the inspection target 121 may collide with the inspection target 121. However, at least another part of the incident X-rays (X1) may be transmitted through the inspection target 121. The incident X-rays (X1) transmitted through the inspection target 121 are referred to herein as first transmitted X-rays (X2) for convenience. That is, at least a part or portion of the incident X-rays (X1) may collide with the inspection target 121 to generate the characteristic X-rays (X3), and at least another part or portion of the incident X-rays (X1) may be transmitted through the inspection target 121 to become the first transmitted X-rays (X2).

The detection unit 130 may be disposed on or under the second surface 120b of the stage 120. That is, the stage 120 may be disposed between the X-ray output unit 110 and the detection unit 130. The detection unit 130 may receive the first transmitted X-rays (X2). The detection unit 130 will be described in more detail with reference to FIGS. 3A to 3E.

FIGS. 3A to 3E are illustrative diagrams for explaining a detection unit of an apparatus for X-ray inspection according to some embodiments.

Figure 3A:
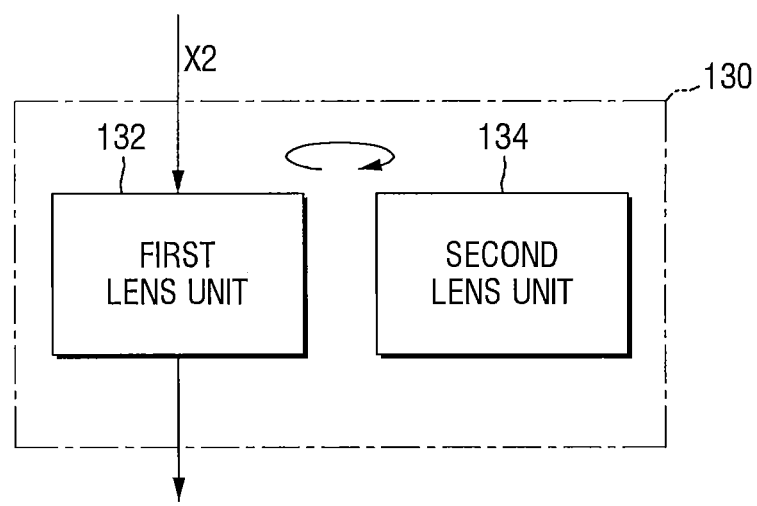
FIGS. 3A to 3E are illustrative diagrams for explaining a detection unit of an apparatus for X-ray inspection according to some embodiments.
Figure 3B:
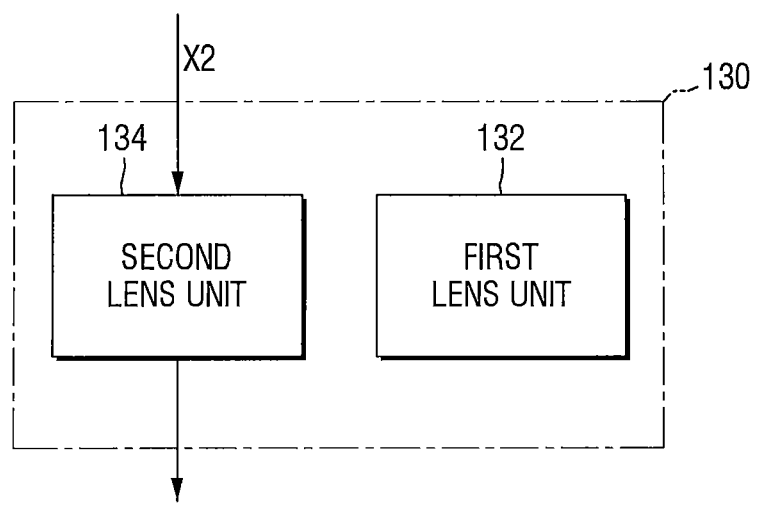

Referring to FIGS. 3A and 3B, the detection unit 130 may include a first lens unit or first lens system 132 and a second lens unit or second lens system 134. The positions of the first lens unit 132 and the second lens unit 134 may be mutually changed through appropriate means. That is, when using the apparatus 100 for X-ray inspection according to some embodiments, any one of the first lens unit 132 and the second lens unit 134 may be selected as a path of the detection unit 130. In other words, the first transmitted X-rays (X2) may pass through the first lens unit 132. Alternatively, the first transmitted X-rays (X2) may pass through the second lens unit 134.

For example, the first lens unit 132 and the second lens unit 134 may be attached to a rotary plate. Any one of the first lens unit 132 and the second lens unit 134 may be selected by rotating the rotary plate. However, the means for selecting the first lens unit 132 and the second lens unit 134 is not limited thereto. Those having ordinary skill in the technical field of the present inventive concept can achieve this selectivity in various ways.

Figure 3C:
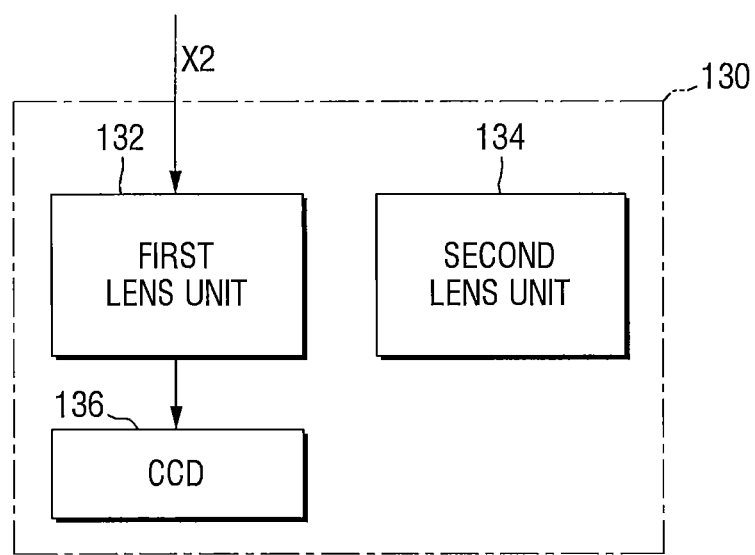

Referring to FIG. 3C, according to some embodiments, the first transmitted X-rays (X2) may be transmitted through the first lens unit 132. Although it is not illustrated in FIG. 3C, it will be appreciated that the first transmitted X-rays (X2) may pass through the second lens unit 134.

A charged coupled device (CCD) sensor 136 may receive the first transmitted X-rays (X2) transmitted through the first lens unit 132. The CCD sensor 136 may receive the first transmitted X-rays (X2) transmitted through the second lens unit 134. The CCD sensor 136 may be a sensor that sequentially converts analog signals into electrical signals.

Figure 3D:
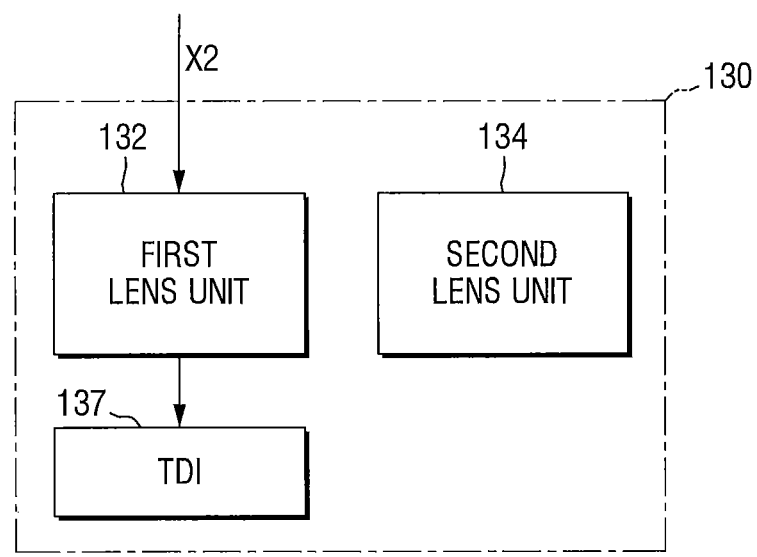

Referring to FIG. 3D, according to some embodiments, the first transmitted X-rays (X2) may pass through the first lens unit 132. Although it is not illustrated in FIG. 3D, it will be appreciated that the first transmitted X-rays (X2) may pass through the second lens unit 134.

A time delay integration (TDI) sensor 137 may receive the first transmitted X-rays (X2) having passed through the first lens unit 132. The TDI sensor 137 may receive the first transmitted X-rays (X2) having passed through the second lens unit 134. The sensing of the TDI sensor 137 may be synchronized with the movement speed of the inspection target 121. The TDI sensor 137 may be a sensor that accumulates the amount of light while delaying the time. In some embodiments, the inspection target 121 may move little by little. The TDI sensor 137 may accumulate the luminance value in accordance with the movement speed of inspection target 121. Therefore, when the TDI sensor 137 is used, a large amount of light for imaging may be secured. Also, the TDI sensor 137 may have the improvement effect of noise. Further, the TDI sensor 137 may perform imaging at a higher speed than the CCD sensor 136.

Figure 3E:
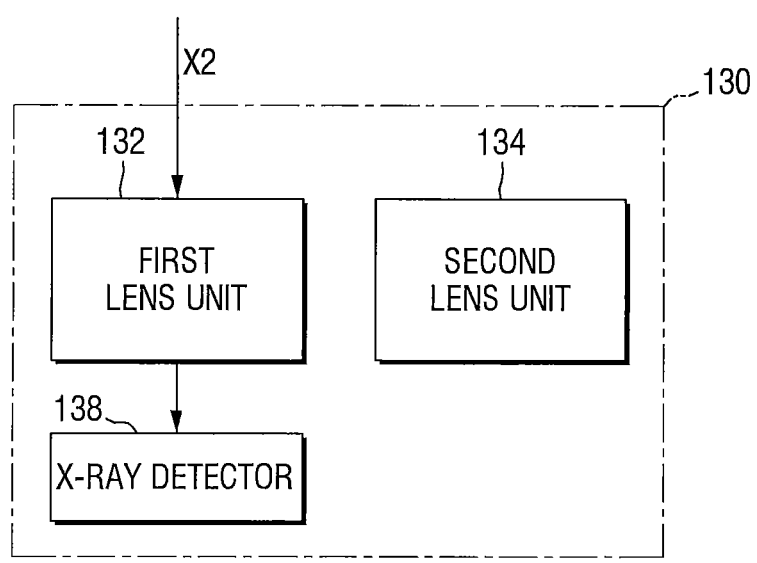

Referring to FIG. 3E, according to some embodiments, the first transmitted X-rays (X2) may pass through the first lens unit 132. Although it is not illustrated in FIG. 3E, the first transmitted X-rays (X2) may, of course, pass through the second lens unit 134.

An X-ray detector 138 may receive the first transmitted X-rays (X2) that have passed through the first lens unit 132. The X-ray detector 138 may receive the first transmitted X-rays (X2) that have passed through the second lens unit 134. The X-ray detector 138 may be a device that detects or expresses the amount of the received X-ray as the brightness of light. That is, the X-ray detector 138 may be a device for imaging on the basis of the amount of the received X-rays.

Details of the first lens unit 132 and the second lens unit 134 according to some embodiments will be described with reference to FIGS. 4 to 6B.

Figure 4:
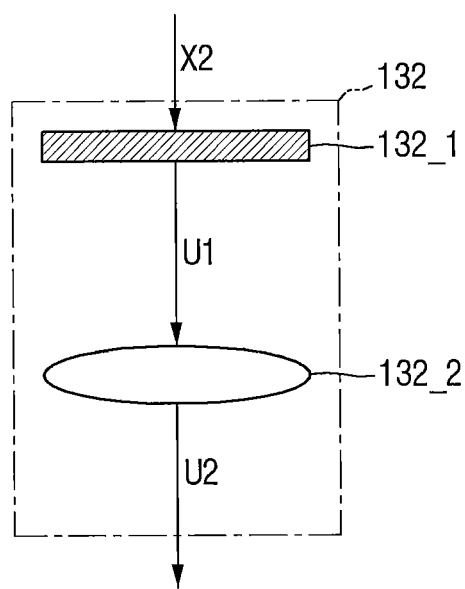
FIG. 4 is an example diagram for illustrating a first lens unit according to some embodiments.

FIG. 4 is an example diagram for illustrating a first lens unit according to some embodiments.

Referring to FIG. 4, the first lens unit 132 may include a first scintillator 132_1, and a magnifying lens 132_2 of n-magnification (n>1).

The first scintillator 132_1 may receive the first transmitted X-rays (X2). The first scintillator 132_1 may convert the first transmitted X-rays (X2) into another kind or type of light. The first scintillator 132_1 may include, but is not limited to, NaI (TI), CsI (TI), ZnSI (Ag), and GoS. In some embodiments, the first scintillator 132_1 may convert the first transmitted X-rays (X2) into the first UV ultraviolet rays (U1).

In some embodiments, the magnifying lens 132_2 may receive light. The magnifying lens 132_2 may focus the received light at a specific position. The magnifying lens 132_2 may be an optically convex lens, but is not limited thereto. For example, the first ultraviolet rays (U1) may pass through the magnifying lens 132_2. The first ultraviolet rays (U1) that have passed through the magnifying lens 132_2 may be focused at a specific position. For convenience of explanation, the first ultraviolet rays (U1) that have passed through the magnifying lens 132_2 are referred to herein as second ultraviolet rays (U2).

The second ultraviolet rays (U2) may be transmitted to the CCD sensor 136 or the TDI sensor 137 of the detection unit 130. In other words, the first ultraviolet rays (U1) may pass through the magnifying lens 132_2 and may be focused on the CCD sensor 136 or the TDI sensor 137. The CCD sensor 136 or the TDI sensor 137 may receive and image the second ultraviolet rays (U2).

In some embodiments, the image obtained by imaging the second ultraviolet rays (U2) may be an image enlarged by n times (n>1) by the magnifying lens 132_2.

Figure 5A:
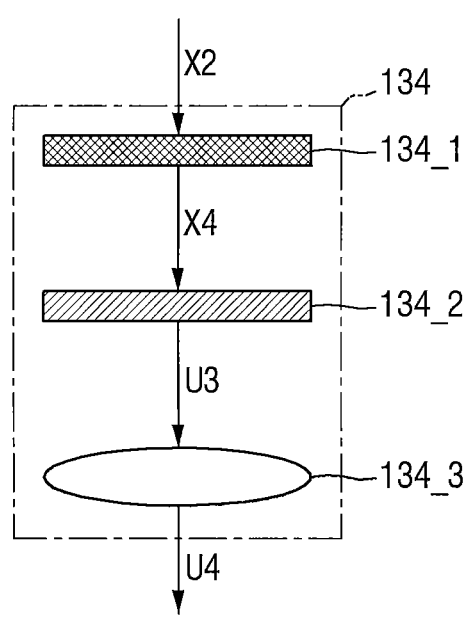
FIGS. 5A and 5B are example diagrams for illustrating a second lens unit according to some embodiments.
Figure 5B:
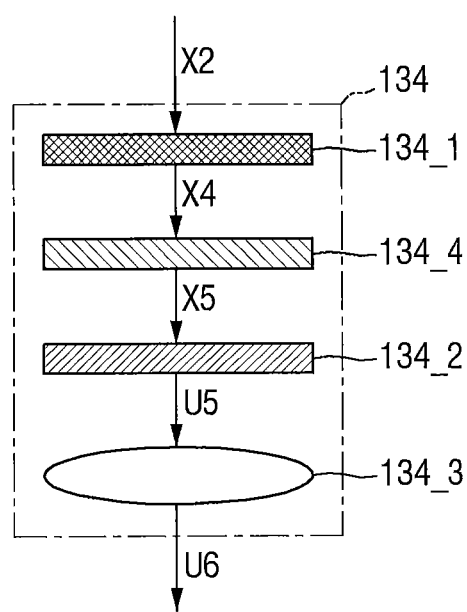

FIGS. 5A and 5B are example diagrams for illustrating a second lens unit according to some embodiments.

Referring to FIG. 5A, the second lens unit 134 may include a micro zone plate (MZP) 134_1, a second scintillator 134_2, and a relay lens 134_3 of equal magnification.

The micro zone plate 134_1 may receive X-rays. The micro zone plate 134_1 may focus the X-rays at a specific position. When the micro zone plate 134_1 focuses the X-rays at a specific position, the micro zone plate 134_1 may utilize diffraction phenomena. The micro zone plate 134_1 may be constituted by alternately and repeatedly arranging transparent rings and opaque rings.

In some embodiments, the micro zone plate 134_1 may receive the first transmitted X-rays (X2). The micro zone plate 134_1 may focus the received first transmitted X-rays (X2) at a specific position. For convenience of explanation, the first transmitted X-rays (X2) that have passed through the micro zone plate 134_1 are referred to herein as second transmitted X-rays (X4). In other words, the micro zone plate 134_1 may convert the first transmitted X-rays (X2) into the second transmitted X-rays (X4).

The magnitude of the image transmitted by the second transmitted X-rays (X2) may be greater by m times (m>n>1) than the magnitude of the image transmitted by the first transmitted X-rays (X1). In other words, the magnitude of the image to be transmitted to the second scintillator 134_2 may be greater by m (m>n>1) times than before passing through the micro zone plate 134_1.

The second scintillator 134_2 may receive the second transmitted X-rays (X4). The second scintillator 132_2 may convert the second transmitted X-rays (X4) into another kind or type of light. The second scintillator 134_2 may include, but is not limited to, NaI (TI), CsI (TI), ZnSI (Ag), and GoS. In some embodiments, the second scintillator 134_2 may convert the second transmitted X-rays (X4) into the third ultraviolet rays (U3).

In some embodiments, the relay lens 134_3 may receive light. The relay lens 134_3 may focus the received light at a specific position. However, unlike the magnifying lens 132_2, the relay lens 134_3 may have the equal magnification. In other words, the magnitude of the image taken the relay lens 134_3 may be the same as the magnitude of the image before passing through the relay lens 134_3.

For example, the relay lens 134_3 may receive the third ultraviolet rays (U3). The relay lens 134_3 may focus the third ultraviolet rays (U3) at a specific position at the equal magnification. For convenience of explanation, the third ultraviolet rays (U3) that have passed through the relay lens 134_3 are referred to herein as the fourth ultraviolet rays (U4).

The fourth ultraviolet rays (U4) may be transmitted to the CCD sensor 136 or the TDI sensor 137 of the detection unit 130. In other words, the third ultraviolet rays (U3) may pass through the relay lens 134_3 and may be focused on the CCD sensor 136 or the TDI sensor 137. The CCD sensor 136 or the TDI sensor 137 may receive and image the fourth ultraviolet rays (U4).

In some embodiments, the image obtained by imaging the fourth ultraviolet rays (U4) may be image enlarged by m times (m>n>1) by the micro zone plate 134_1.

Referring to FIG. 5B, the second lens unit 134 includes a micro zone plate 134_1, a second scintillator 134_2, a relay lens 134_3 of equal magnification, and a phase plate 134_4. For convenience of explanation, the same or similar contents as described above may be omitted or briefly explained.

In some embodiments, the micro zone plate 134_1 may convert the first transmitted X-rays (X2) into the second transmitted X-rays (X4). The magnitude of the image transmitted by the second transmitted X-rays (X2) may be greater by m times (m>n>1) than the magnitude of the image transmitted by the first transmitted X-rays (X1).

The second transmitted X-rays (X4) may pass through the phase plate 134_4 and may be converted into the third transmitted X-rays (X5).

A phase difference may occur in the light transmitted through the phase plate 134_4. For example, the phase plate 134_4 may include a flat glass plate, and a transparent thin film adhered or glued to a partial region on the flat glass plate. At this time, a phase difference may be generated between the light passing through the flat glass plate and the light passing through the transparent thin film.

In some embodiments, the phase plate 134_4 may receive the second transmitted X-rays (X4). The phase plate 134_4 may generate a phase difference in the received second transmitted X-rays (X4). For convenience of explanation, the second transmitted X-rays (X4) in which the phase difference has occurred are referred to herein as third transmitted X-rays (X5). In other words, the phase plate 134_4 may convert the second transmitted X-rays (X4) into the third transmitted X-rays (X5). At least some parts or portions of the third transmitted X-rays (X5) may be different from the second transmitted X-rays (X4) in the phase.

The third transmitted X-rays (X5) may pass through the second scintillator 134_2 and may be converted into fifth ultraviolet rays (U5). The fifth ultraviolet rays (U5) may pass through the relay lens 134_3 of the equal magnification and may be converted into the sixth ultraviolet rays (U6).

The sixth ultraviolet rays (U6) may be transmitted to the CCD sensor 136 or the TDI sensor 137 of the detection unit 130. The CCD sensor 136 or the TDI sensor 137 may image the received sixth ultraviolet rays (U6).

In some embodiments, the image obtained by imaging the sixth ultraviolet rays (U6) may be an image which is enlarged by m times (m>n>1) by the micro zone plate 134_1 and in which the phase difference is generated by the phase plate 134_4.

Figure 6A:
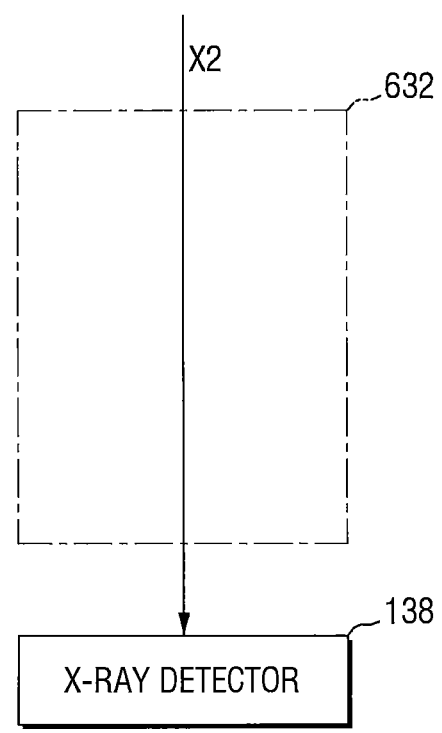
FIG. 6A is an example diagram for illustrating a first lens unit according to some other embodiments.

FIG. 6A is an example diagram for illustrating a first lens unit according to some other embodiments.

Figure 6B:
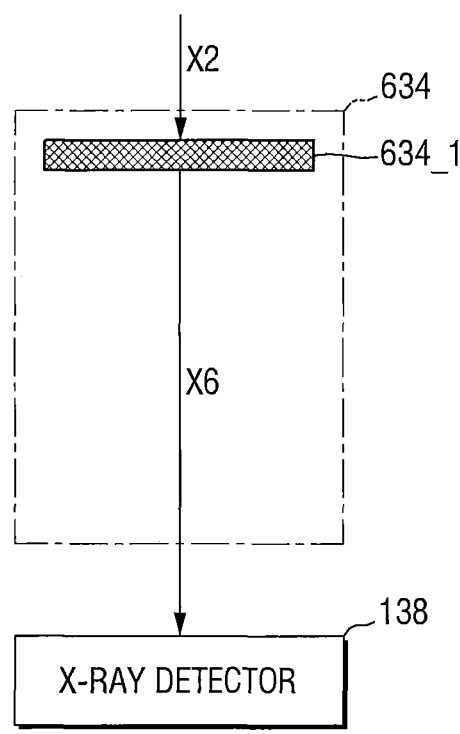
FIG. 6B is an example diagram for illustrating a second lens unit according to some other embodiments.

FIG. 6B is an example diagram for illustrating a second lens unit according to some other embodiments. For convenience of explanation, the same or similar contents as described above may be briefly described or omitted.

Referring to FIG. 6A, the first transmitted X-rays (X2) may pass through the first lens unit 632. The X-ray detector 138 may receive the first transmitted X-rays (X2) that have passed through the first lens unit 632. The X-ray detector 138 may image the received first transmitted X-rays (X2).

Referring to FIG. 6B, the micro zone plate 634_1 of the second lens unit 634 may convert the first transmitted X-rays (X2) into the fourth transmitted X-rays (X6). That is, the fourth transmitted X-rays (X6) may be the first transmitted X-rays (X2) that have passed through the micro zone plate 634_1. The fourth transmitted X-rays (X6) may be received by the X-ray detector 138. The X-ray detector 138 may image the received fourth transmitted X-rays (X6).

In some embodiments, the image obtained by imaging the fourth transmitted X-rays (X6) may be image enlarged by m times (m>n>1) by the micro zone plate 634_1.

Figure 7:
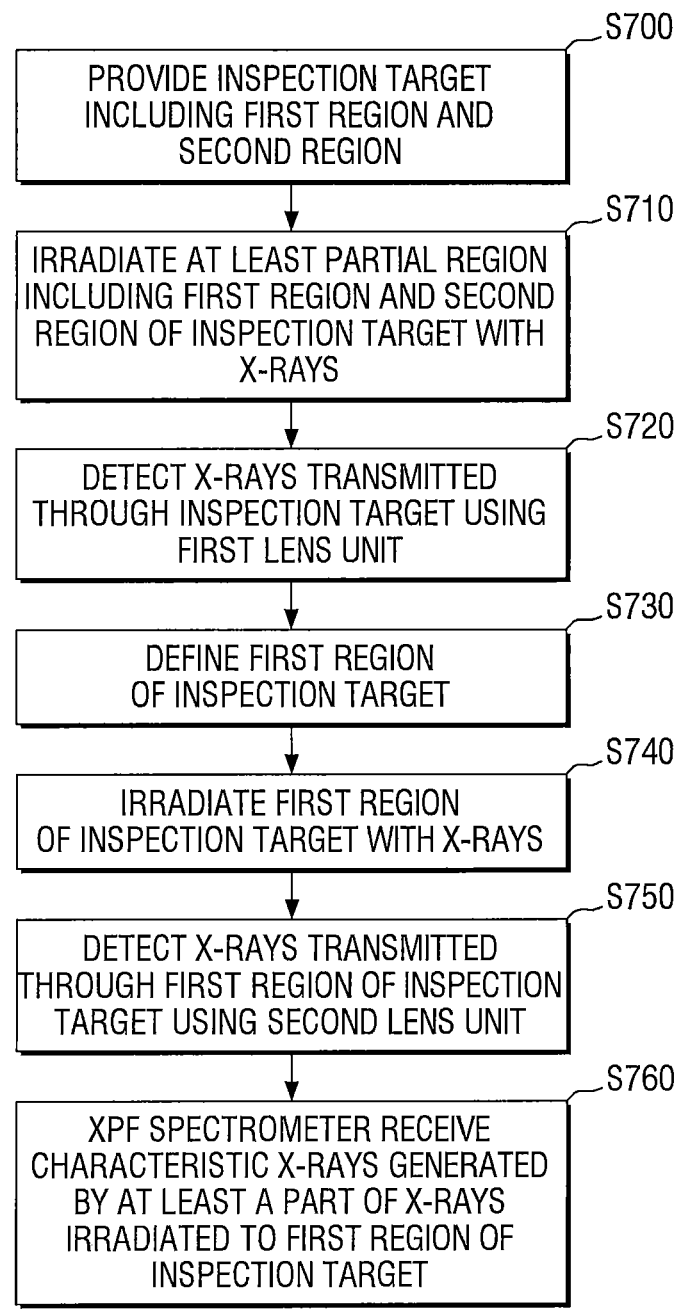
FIG. 7 is an example flowchart for explaining an inspection method using an apparatus for X-ray inspection according to some embodiments.

FIG. 7 is an example flowchart for explaining an inspection method, using an apparatus for X-ray inspection according to some embodiments.

Referring to FIG. 7, an inspection target including a first region and a second region may be provided (S700). For the explanation of the first region and the second region, reference is made to FIG. 8.

Figure 8:
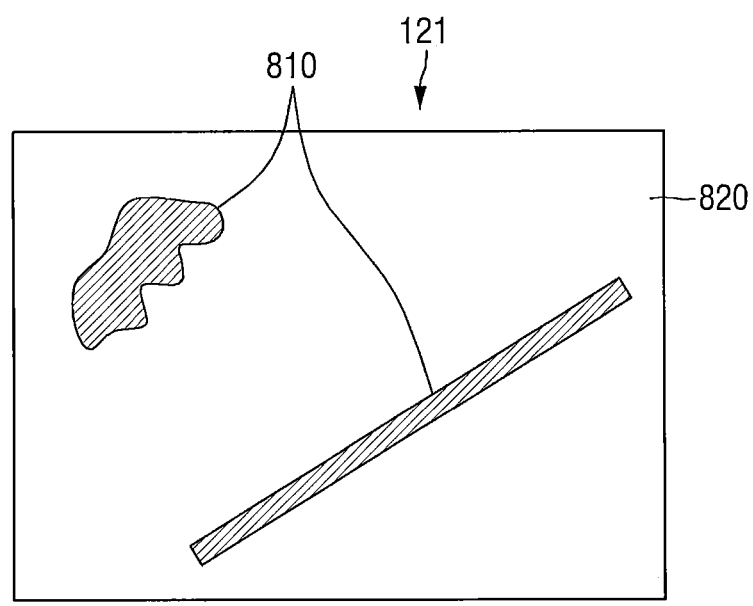
FIG. 8 is an example diagram for illustrating a first region and a second region of an inspection target according to some embodiments.

FIG. 8 is an example diagram for illustrating a first region and a second region of an inspection target according to some embodiments.

Referring to FIG. 8, the inspection target 121 may include a first region 810 and a second region 820.

According to some embodiments, the first region 810 may include defects. Also, the second region 820 may not include defects. In some embodiments, the first region 810 may be defined, using the first lens unit 132 and 632.

In other words, the apparatus 100 for X-ray inspection may explore the defects, using the first lens unit 132 and 632. The detected defects may be included in the first region 810. That is, the first region 810 may be a region in which a defect exists. A portion other than the first region 810, that is, a region with no defect may be included in the second region 820.

Although it is illustrated in FIG. 8 that the inspection target 121 has a rectangular shape, the present inventive concept is not limited thereto. For example, the inspection target 121 may be in the form of a wafer.

Referring again to FIG. 7, at least a partial region or portion including the first region 810 and the second region 820 of the inspection target 121 may be irradiated with the incident X-rays (X1) (S710). In other words, at least a part of the inspection target 121 including the first region 810 and the second region 820 may be irradiated with the incident X-rays (X1). At this time, at least a part of the incident X-rays (X1) may be transmitted through the inspection target 121. The incident X-rays (X1) transmitted through the inspection target 121 are referred to herein as the first transmitted X-rays (X2) for convenience of explanation.

The first transmitted X-rays (X2) transmitted through the first region 810 and the second region 820 may be detected, using the first lens units 132 and 632 (S720).

In some embodiments, the first transmitted X-rays (X2) may pass through the first lens unit 132 and may be converted into second ultraviolet rays (U2). The CCD sensor 136 or the TDI sensor 137 may receive and image the second ultraviolet rays (U2). The image taken using the first lens unit 132 may be image enlarged by n times (n>1).

In some other embodiments, the first transmitted X-rays (X2) may pass through the first lens unit 632 and may be received by the X-ray detector 138. The X-ray detector 138 may image the first transmitted X-rays (X2).

The first region 810 of the inspection target 121 may be defined (S730).

In some embodiments, the captured image may be analyzed (e.g., visually analyzed) to define the first region 810 and the second region 820. For example, when capturing an image using the first lens units 132 and 632, the regions may be represented by a region having a defect and a region having no defect as illustrated in FIG. 8. At this time, it is possible to define the region having the defect as the first region 810 and to define the region having no defect as the second region 820, using the visually expressed image.

In some other embodiments, the first region 810 and the second region 820 may be defined, using an inspection algorithm. For specific explanation of the inspection algorithm, reference is made to FIGS. 9A and 9B.

Figure 9A:
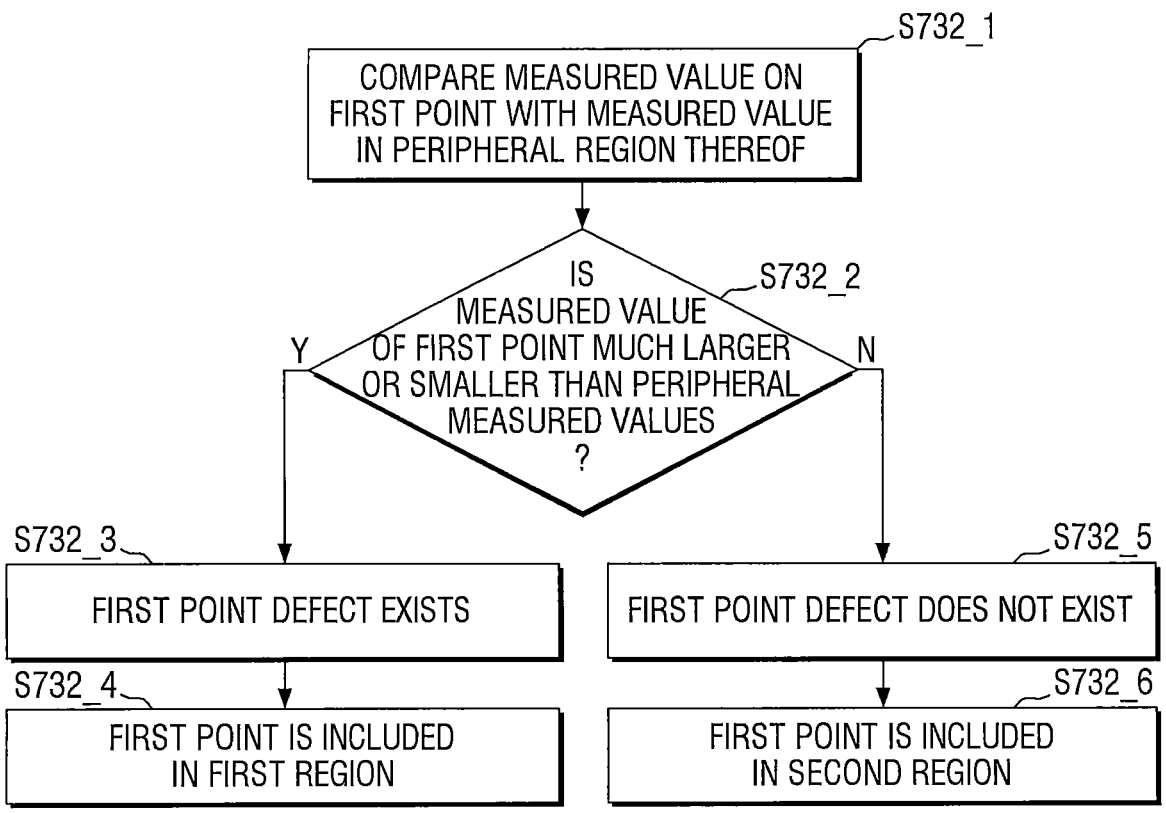
FIG. 9A is an example flowchart for illustrating a method for defining a first region of an inspection target according to some embodiments.

FIG. 9A is an example flowchart for illustrating a method for defining a first region of an inspection target according to some embodiments.

Figure 9B:
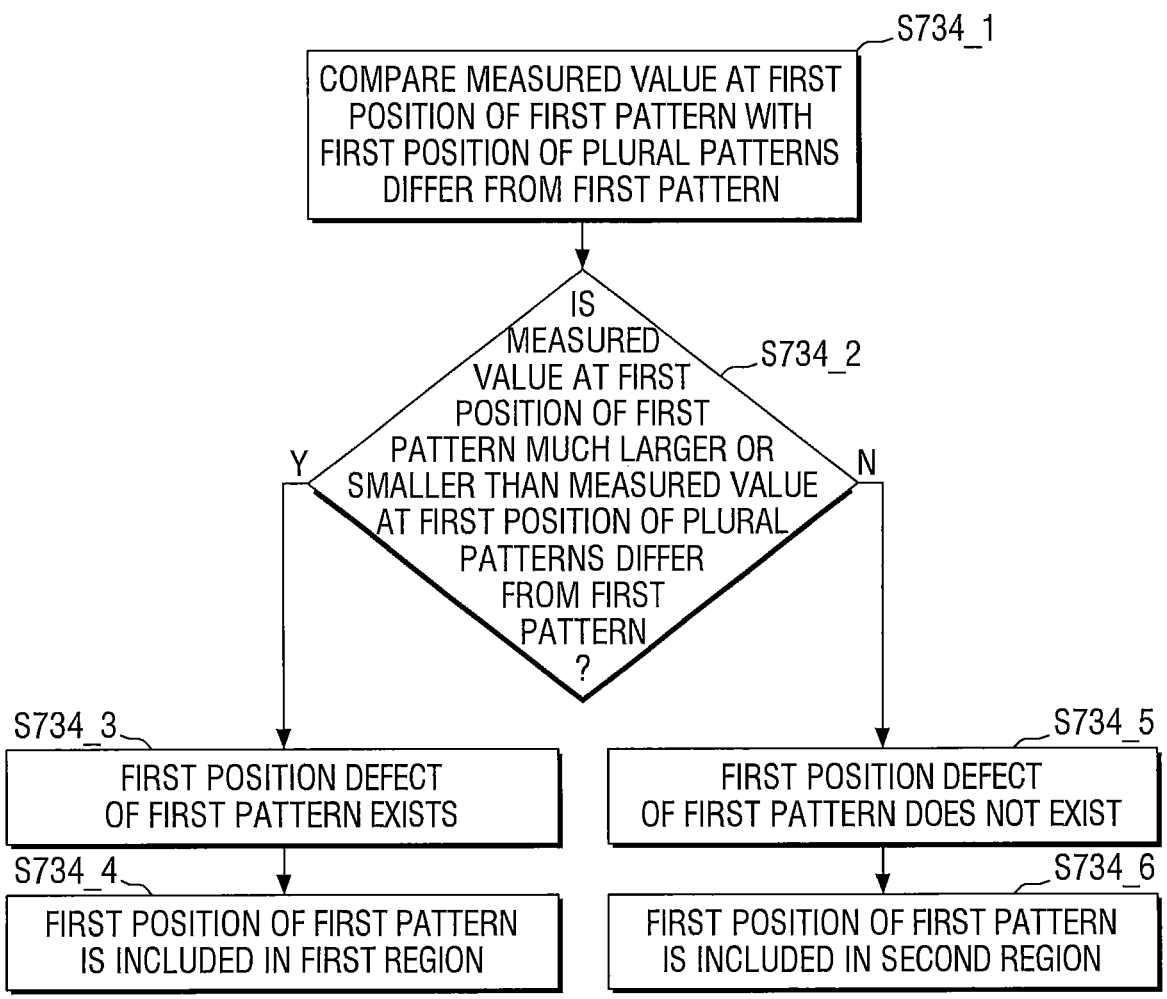
FIG. 9B is an example flowchart for explaining a method for defining the first region of the inspection target according to some other embodiments.

FIG. 9B is an example flowchart for explaining a method for defining the first region of the inspection target according to some other embodiments.

First, referring to FIG. 9A, the measured value at the first point may be compared with the measured value at the peripheral region of the first point (S732_1). For example, the measured value may be an electrical signal, the intensity of the received light, or the like.

It is possible to determine whether the measured value at the first point is much larger or smaller than the measured value around the first point (S732_2). That is, it is possible to determine whether the measured value at the first point is a unique signal as compared with the measured value around the first point.

If the measured value at the first point is much larger or smaller than (e.g., different than) the measured value around the first point, a defect may exist on the first point (S732_3). If there is a defect at the first point, the first point may be included in the first region 810 of the inspection target 121 (S732_4).

If the measured value at the first point is not much larger or smaller than (e.g., not different than) the measured value around the first point, a defect may not exist on the first point (S732_5). If there is no defect at the first point, the first point may be included in the second region 820 of the inspection target 121 (S732_6).

Referring to FIG. 9B, when the inspection target 121 includes a plurality of patterns, the measured value at the first position of the first pattern may be compared with the measured value at the first position of the plurality of patterns different from the first pattern (S734_1).

It is possible to determine whether the measured value at the first position of the first pattern is much larger or smaller than (e.g., different than) the measured value at the first position of the plurality of patterns different from the first pattern (S734_2).

If the measured value at the first position of the first pattern is much larger or smaller than (e.g., different than) the measured value at the first position of the plurality of patterns different from the first pattern, a defect may exist at the first position of the first pattern (S734_3).

The inspection target 121 may include a plurality of identical and repeated patterns. Therefore, the values measured at the same position of each pattern may have the same or similar values to each other. If, however, the measured value at the first position of the first pattern is much larger or smaller than (e.g., different than) the measured value at the first position of the plurality of patterns different from the first pattern, that is, if the measured value at the first position of the first pattern is an unique signal, the first position of the first pattern may have a defect. If a defect exists at the first position of the first pattern, the first position of the first pattern may be included in the first region 810 (S734_4).

If the measured value at the first position of the first pattern is not much larger or smaller than (e.g., not different than) the measured value at the first position of the plurality of patterns different from the first pattern, no defect may exist at the first position of the first pattern (S734_5). When there is no defect at the first position of the first pattern, the first position of the first pattern may be included in the second region 820 (S734_6).

Although the methods according to several embodiments for defining the first region 810 and the second region 820 have been described in FIGS. 9A and 9B, the present inventive concept is not limited thereto. Those having ordinary skill in the technical field of the present inventive concept may define the first region 810 and the second region 820 using various methods and algorithms.

In some embodiments, after defining the first region 810 and the second region 820 of the inspection target 121 in accordance with FIGS. 9A and 9B, a defect map (1000 of FIG. 10) may be generated.

According to some embodiments of the present inventive concept, although the first region 810 and the second region 820 have been described as being defined through the first lens units 132 and 632, the present inventive concept is not limited thereto. For example, the first region 810 may be defined in an apparatus different from the apparatus 100 for X-ray inspection according to some embodiments of the present inventive concept. That is, the inspection target with the first region 810 defined thereon may be provided to the apparatus 100 for X-ray inspection. For example, a defect map 1000 generated by an apparatus different from the apparatus 100 for X-ray inspection may be provided. For a specific explanation of the defect map 1000, a reference is made to FIG. 10.

Figure 10:
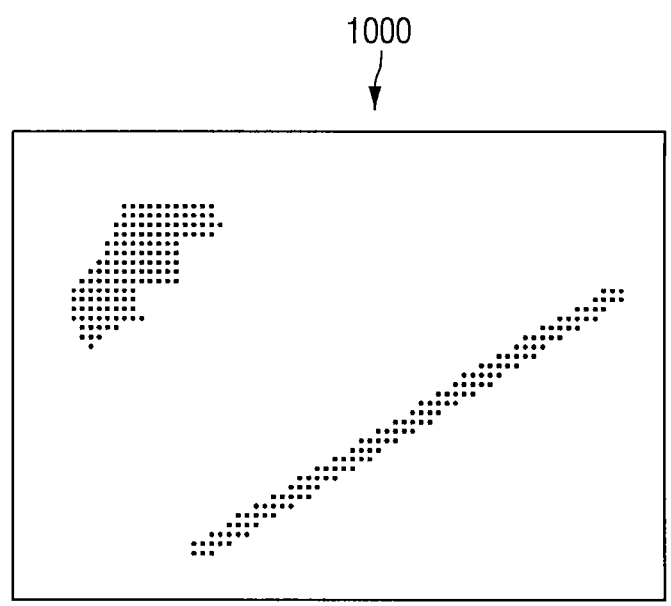
FIG. 10 is an example diagram for illustrating a defect map according to some embodiments.

FIG. 10 is an example diagram for illustrating a defect map according to some embodiments.

Referring to FIG. 10, the defect map 1000 may include a plurality of points. Each point may refer to a first region 810 defined in accordance with some embodiments. That is, each point may mean that a defect exists. As described above, the defect map 1000 may be generated, using the apparatus 100 for X-ray inspection according to some embodiments of the present inventive concept. Alternatively, the defect map 1000 may be generated by an apparatus different from the apparatus 100 for X-ray inspection, and may be transmitted to the apparatus 100 for X-ray inspection.

Referring again to FIG. 7, the defined first region 810 of the inspection target 121 may be irradiated with the incident X-rays (X1) (S740). That is, the incident X-rays (X1) may be irradiated only to the region in which the defect exists in the inspection target 121. At least a part of the incident X-rays (X1) may be transmitted through the inspection target 121 and may be converted into the first transmitted X-rays (X2).

The first transmitted X-rays (X2) transmitted through the first region 810 of the inspection target 121 may be detected using the second lens units 134 and 634 (S750). For example, the first transmitted X-rays (X2) may pass through the second lens unit 134 and may be converted into fourth ultraviolet rays (U4). The CCD sensor 136 or the TDI sensor 137 may receive and image the fourth ultraviolet rays (U4).

In another example, the first transmitted X-rays (X2) may pass through the second lens unit 634 and may be converted into the fourth transmitted X-rays (X6). The fourth transmitted X-rays (X6) may be received by the X-ray detector 138. The X-ray detector 138 may receive and image the fourth transmitted X-rays (X6).

In some embodiments, the image captured using the second lens units 134 and 634 may be an image enlarged by m times (m>n>1).

In conclusion, the second lens units 134 and 634 may be used only in the first region 810. For example, the second lens units 134 and 634 may be used only at the positions of the points of the defect map 1000.

In some embodiments, at least a part or portion of the incident X-rays X1 irradiated to the first region 810 may be absorbed by the inspection target 121 to generate characteristic X-rays X3. The characteristic X-rays (X3) may be received and detected by the XRF spectrometer 140 (S760). Components constituting the first region 810 of the inspection target 121 and the like may be analyzed through the XRF spectrometer 140. In other words, XRF spectrometer 140 may analyze the components of defects and the like.

In other words, in at least a partial region of the inspection target 121, existence or absence of defect and the position of the defect may be explored through the first lens units 132 and 632. That is, the first region 810 may be defined through the first lens units 132 and 632.

The form (e.g., location or size or shape) of the defect of the object 121 may be detected with a high magnification (m magnification, m>n>1) through the second lens units 134 and 634. Further, the constituent components of the defect of the inspection target 121 may be detected through the XRF spectrometer 140. That is, in the first region 810, the form of the defect is analyzed via the second lens units 134 and 634, and the constituent elements of the defect may be analyzed via the XRF spectrometer 140.

Referring again to FIG. 1, the computing device 150 may execute a series of processes of an inspection method using the apparatus 100 for X-ray inspection described in FIG. 7.

For example, the computing device 150 may select whether to use one of the lens units of the first lens units 132 and 632 and the second lens units 134 and 634.

Also, for example, the computing device 150 may synchronize the movement speed of inspection target 121 and the sensing speed of the TDI sensor 137.

Also, for example, in order to define the first region 810 and the second region 820, the computing device 150 may control at least a partial region of the inspection target 121 to perform imaging using the first lens units 132 and 632.

Also, for example, the computing device 150 may execute the processes described in FIGS. 9A and 9B to define the first region 810 and the second region 820. The computing device 150 may generate the defect map 1000 using the defined first region 810 and the second region 820. Further, the computing device 150 may image the form of the defect using the second lens units 134 and 634 in the first region 810. In addition, the computing device 150 may analyze the components of the defect using the XRF spectrometer 140 in the first region 810.

In another alternative embodiment, the computing device 150 may receive the defect map 1000 from an apparatus different from the apparatus 100 for X-ray inspection. The computing device 150 may irradiate the incident X-rays (X1) in the first region 810 via the defect map 1000 received from another device.

The computing device 150 may perform any actions executable on the computing device 150 in addition to the aforementioned examples.

Figure 11:
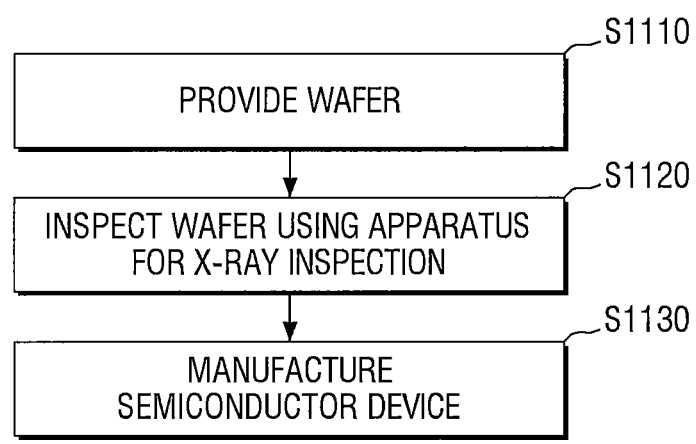
FIG. 11 is an example flowchart for illustrating a method for manufacturing a semiconductor device according to some embodiments.

FIG. 11 is an example flowchart for illustrating a method for manufacturing a semiconductor device according to some embodiments.

Referring to FIG. 11, a wafer is provided (S1110). The wafer is inspected, using the apparatus 100 for X-ray inspection according to some embodiments of the present inventive concept described with reference to FIGS. 1 to 10 (S1120). Next, the semiconductor device is manufactured on the wafer (S1130).

According to some embodiments, it is possible to check whether a defect exists in a bare wafer using the apparatus 100 for X-ray inspection. According to some other embodiments, it is possible to check whether a defect exists in the wafer on which the structure is formed using the apparatus 100 for X-ray inspection. Therefore, the method for manufacturing the semiconductor device according to some embodiments may be executed irrespective of the sequence illustrated in FIG. 11. In addition, the method for manufacturing the semiconductor device according to some embodiments may be repeatedly executed.

For example, it is possible to check whether there is a defect in the bare wafer using the apparatus 100 for X-ray inspection. The bare wafer with no defect may be selected and provided to a semiconductor manufacturing apparatus. Thereafter, after a structure is formed on the wafer by performing a vapor deposition/thin film process, a photo process, and/or an etching process, it is possible to check whether there is a defect in the wafer or the structure on the chip included in the wafer, using the apparatus 100 for X-ray inspection. It is possible to execute a packaging process by selecting a wafer or a chip having no defect in the structure. After executing the packaging process, it is possible to inspect the presence or absence of a defect, using the apparatus 100 for X-ray inspection again.

Although the embodiments of the present inventive concept have been described with reference to the accompanying drawings, those skilled in the art to which this inventive concept pertains will appreciate that the inventive concept can be implemented in other specific forms without changing the technical idea or the essential features thereof. It is therefore to be understood that the above-described embodiments are illustrative in all aspects and not restrictive.

What is claimed is:

1. An apparatus for X-ray inspection comprising:
a stage on which an inspection target is loaded, the stage including a first surface and an opposite second surface;
an X-ray generator disposed on or over the first surface of the stage and configured to irradiate the inspection target with incident X-rays; and
a detection system disposed on or under the second surface of the stage and configured to detect first transmitted X-rays transmitted through the inspection target,
wherein the detection system includes a first lens system and a second lens system, the first transmitted X-rays pass through one of the first lens system and the second lens system, the second lens system includes a micro zone plate (MZP), the first lens system comprises a first scintillator and a magnifying lens of n magnification, with n being greater than one, the second lens system comprises a second scintillator and a relay lens, when the first transmitted X-rays pass through the first lens system, the first transmitted X-rays pass through the first scintillator and are converted into first rays, and the first rays pass through the magnifying lens and are converted into second rays, and when the first transmitted X-rays pass through the second lens system, the first transmitted X-rays pass through the micro zone plate and are converted into second transmitted X-rays, the second transmitted X-rays pass through the second scintillator and are converted into third rays, and the third rays pass through the relay lens and are converted into fourth rays.

2. The apparatus for X-ray inspection of claim 1, wherein the detection system further comprises a time delay integration (TDI) sensor, and the TDI sensor is configured to receive and image one of the second rays and the fourth rays.

3. The apparatus for X-ray inspection of claim 1, further comprising:

an X-Ray fluorescence (XRF) spectrometer disposed on or over the first surface of the stage.

4. The apparatus for X-ray inspection of claim 3, wherein, when the inspection target is irradiated with the incident X-rays, at least a portion of the incident X-rays collides with the inspection target to generate characteristic X-rays, and the XRF spectrometer is configured to receive the characteristic X-rays.

5. The apparatus for X-ray inspection of claim 1, wherein the first lens system and the second lens system are selectable, and by selecting one of the first lens system and the second lens system, the first transmitted X-rays pass through the first lens system or the first transmitted X-rays pass through the second lens system.

6. The apparatus for X-ray inspection of claim 1, further comprising:

a controller, wherein the inspection target comprises a first region including a defect and a second region not including defects, the controller is configured to detect the first transmitted X-rays through the first lens system in the first region and the second region to define the first region due to one or more measured values at the first region that are different than one or more measured values at the second region, and the controller is configured to detect the first transmitted X-rays in the first region through the second lens system.

7. The apparatus for X-ray inspection of claim 6, wherein the inspection target comprises repetitive patterns, and the controller is configured to compare the repetitive patterns to define the first region.

8. The apparatus for X-ray inspection of claim 6, wherein the controller is configured to generate a defect map of the first region.

9. The apparatus for X-ray inspection of claim 1, further comprising:

a controller, wherein the inspection target comprises a first region including a defect and a second region not including defects, the controller is configured to receive input information on a position of the first region, and the controller is configured to detect the first transmitted X-rays in the first region through the second lens system.

10. The apparatus for X-ray inspection of claim 1, wherein the relay lens has equal magnification.

11. The apparatus for X-ray inspection of claim 1, wherein each of the first to fourth rays are ultraviolet rays.

12. An apparatus for X-ray inspection comprising:

a stage on which an inspection target is loaded, the stage including a first surface and an opposite second surface;

an X-ray generator disposed over the first surface of the stage and configured to irradiate the inspection target with incident X-rays; and a detection system disposed under the second surface of the stage and configured to detect first transmitted X-rays transmitted through the inspection target, wherein the detection system comprises a first lens system and a second lens system, the inspection target comprises a first region including a defect and a second region that is free of defects, the first lens system is configured to receive the first transmitted X-rays transmitted through one of the first region and the second region, the second lens system is configured to receive the first transmitted X-rays transmitted through only the first region, the first lens system comprises a first scintillator and a magnifying lens of n magnification, with n being greater than one, the second lens system comprises a micro zone plate (MZP), a second scintillator, and a relay lens of an equal magnification, when the first transmitted X-rays pass through the first lens system, the first scintillator is configured to receive the first transmitted X-rays therethrough and to convert the first transmitted X-rays into first rays, and the magnifying lens is configured to receive the first rays therethrough and to convert the first rays into second rays, when the first transmitted X-rays pass through the second lens system, the MZP is configured to receive the first transmitted X-rays therethrough and to convert the first transmitted X-rays into second transmitted X-rays, the second scintillator is configured to receive the second transmitted X-rays therethrough and to convert the second transmitted X-rays into third rays, and the relay lens is configured to receive the third rays therethrough and to convert the third rays into fourth rays.

13. The apparatus for X-ray inspection of claim 12, wherein the detection system further comprises a time delay integration (TDI) sensor, and the TDI sensor is configured to receive and image one of the second rays and the fourth rays.

14. The apparatus for X-ray inspection of claim 12, further comprising:

an X-Ray fluorescence (XRF) spectrometer disposed on or over the first surface of the stage.

15. The apparatus for X-ray inspection of claim 12, further comprising:

a controller, wherein the controller is configured to detect the first transmitted X-rays through the first lens system in the first region and the second region to define the first region, and the controller is configured to detect the first transmitted X-rays in the first region through the second lens system.

16. The apparatus for X-ray inspection of claim 12, wherein the detection system further comprises a charged coupled device (CCD) sensor, and the CCD sensor is configured to receive and image one of the second rays and the fourth rays.

* * * * *